(12) United States Patent
Tanaka (10) Patent No.: US 6,339,350 B1
(45) Date of Patent: Jan. 15, 2002

(54) PHASE DIFFERENCE—CURRENT CONVERSION CIRCUIT

(75) Inventor: Tosiyuki Tanaka, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/512,387

(22) Filed: Feb. 25, 2000

(30) Foreign Application Priority Data

Feb. 26, 1999 (JP) .............................................. 11-49520

(51) Int. Cl.[7] .................................................. H03L 7/06
(52) U.S. Cl. .......................... 327/148; 327/147; 327/153
(58) Field of Search ................................ 327/147, 148, 327/149, 153, 157, 159, 161, 2, 7, 10, 12

(56) References Cited

U.S. PATENT DOCUMENTS

| 5,459,755 A | 10/1995 | Iga et al. ..................... 375/376 |
| 5,896,066 A | * 4/1999 | Katayama et al. ............. 331/17 |
| 6,140,853 A | * 10/2000 | Lo ............................... 327/157 |

FOREIGN PATENT DOCUMENTS

| JP | 6-334517 | 12/1994 |
| JP | 11-220387 | 8/1999 |

* cited by examiner

*Primary Examiner*—Tuan Lam
*Assistant Examiner*—Hiep Nguyen
(74) *Attorney, Agent, or Firm*—Foley & Lardner (57) ABSTRACT

A conversion circuit of the present invention includes a phase comparator for outputting digital signals one of which is in an H level and the other of which is in an L level in the case where phases of input signals do not coincide with each other, and for outputting the digital signals both of which are in the H level in the case where the phases of the input signals coincide with each other, a charge pump circuit for outputting an outflow current only when the first digital signal is in the H level, and for outputting an inflow current only when the second digital signal is in the H level, and a delay circuit for causing the digital signals outputted from the phase comparator to become the L level after a definite delay time in the case where the phases of the input signals coincide with each other.

19 Claims, 10 Drawing Sheets

PHASE DIFFERENCE— CURRENT CONVERSION CIRCUIT

BACKGROUND OF THE INVENTION

1. Field of the Invention

The present invention relates to a phase difference— current conversion circuit used for a PLL circuit or the like.

2. Description of the Related Art

Figure 10:
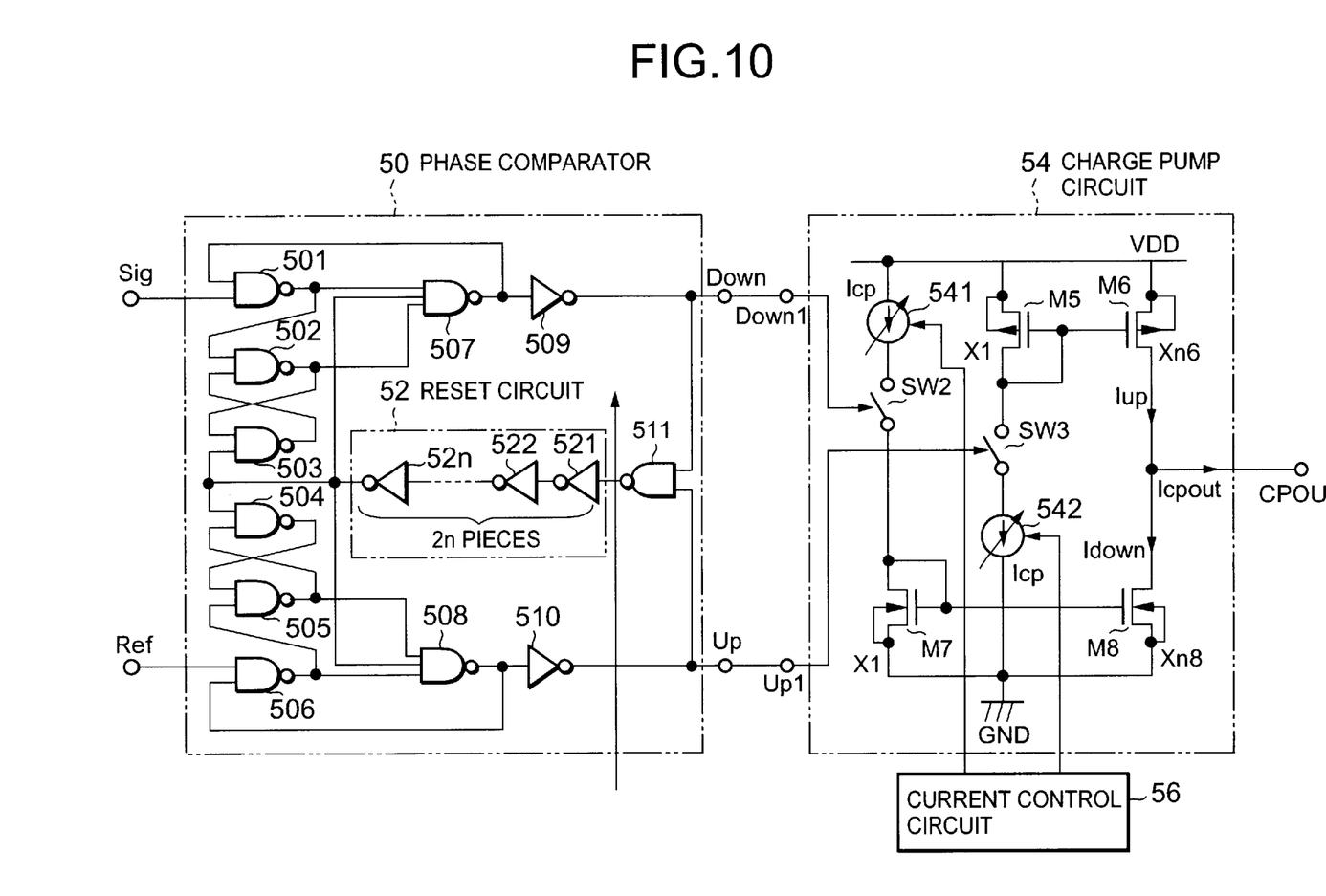
FIG. 10 is a circuit diagram showing a conventional phase difference—current conversion circuit.

FIG. 10 is a circuit diagram showing a conventional phase difference—current conversion circuit. Hereinafter, a description will be made with reference to this drawing.

The conventional phase difference—current conversion circuit includes a phase comparator 50 for outputting a digital signal corresponding to a phase difference of two signals, a charge pump circuit 54 for outputting a current as an analog signal corresponding to the digital signal outputted from the phase comparator 50, and a reset circuit 52 as a delay circuit for resetting the digital signal outputted from the phase comparator 50 after a definite delay time in the case where the phases of the two signals have coincided with each other.

The phase comparator 50 is a general digital phase comparator constituted by NAND gates 501 and 508, and inverters 509 and 510. In the case where the phases of input signals from terminals Sig and Ref do not coincide with each other, one of terminals Up and Down becomes an H level and the other becomes an L level. In the case where the phases of the input signals from the terminals Sig and Ref coincide with each other, both the terminals Up and Down become the H level first, and become the L level after the definite delay time.

The charge pump circuit 54 is a current mirror circuit constituted by transistors M5 to M8, current sources 541 and 542, electric switches SW2 and SW3, and the like. In the case where the terminals Up and Up1 are in the H level, and the terminals Down and Down1 are in the L level, the electric switch SW2 is turned off, and the electric switch SW3 is turned on, so that a current Iup flows out from a terminal CPOUT. On the contrary, in the case where the terminals Up and Up1 are in the L level, and the terminals Down and Down1 are in the H level, the electric switch SW2 is turned on and the electric switch SW3 are turned off, so that a current Idown flows in from the terminal CPOUT. In the case where both the terminals Up and Up1 and the terminals Down and Down1 are in the H level, both the electric switches SW2 and SW3 are turned on, so that the current Idown and the current Iup cancel out each other, and a slight difference between those currents is outputted from the terminal CPOUT. On the contrary, in the case where both the terminals Up and Up1 and the terminals Down and Down1 are in the L level, since both the electric switches SW2 and SW3 are turned off, nothing is outputted from the terminal CPOUT.

The reset circuit 52 is constituted by 2n inverters 521 to 52n connected in series. Conventionally, the number of stages of the inverters 521, . . . or the size of transistors constituting the inverters 521, . . . are adjusted, so that the delay time is adjusted.

A delay time of the reset circuit 52 is set so that the time is equal to a rising delay time of the output current of the charge pump circuit 54. At this time, even in the lock state of PLL in which the input signals from the terminals Sig and Ref of the phase comparator 50 come to have the same phase, the charge pump circuit 54 responds to a very slight phase difference of the input signals from the terminals Sig and Ref, and comes to output a current in proportion to the phase difference. By this, it is possible to avoid a state generally called a dead band in which output current is not in proportion to a phase difference.

Next, problems of the conventional technique will be described.

A first problem is as follows: At the time of PLL lock, a current flowing through the transistor of the output stage of the charge pump is required to have such characteristics that it is cut off after reaching a previously set current value. However, by change of operation conditions of fluctuation of conditions at the time of manufacture, it has not been able to keep the characteristics. This has caused deterioration of noise characteristics.

The reason why the first problem occurs will be described. The delay time of the reset circuit is determined by the gate capacitance of a PMOS transistor and an NMOS transistor constituting an inverter, and the on resistance of a PMOS transistor of the upstream stage inverter. On the contrary, the current rising delay time of the charge pump circuit is determined by a reference current value of the current mirror circuit and gate capacitance of a transistor constituting the current mirror circuit. That is, since the principle based on which the current rising delay time is generated is different between the reset circuit and the charge pump circuit, when power supply voltage, ambient temperature, manufacturing conditions, and the like are changed, the delay time of the reset circuit and the current rising delay time of the charge pump circuit are changed independently from each other. Thus, it has not been able to keep such characteristics that the current flowing through the transistor of the charge pump output stage at the time of PLL lock is cut off after reaching a set current value.

A second problem is as follows: The inverter used as a delay element in the reset circuit has a delay amount per stage for smaller than the current rising delay time of the charge pump circuit. Thus, since several tens stages become necessary for the number of stages of the inverters, it is difficult to set a time in which a charge pump output current at the PLL lock flows, to the optimum length.

The reason why the second problem occurs will be described. When the output current of the charge pump circuit is tried to be set large so as to increase the suppression effect of noise generated in the charge pump circuit, it is necessary to increase the channel width W of a transistor at the output stage. By this, since the gate capacitance of the transistor is increased, the current rising delay time of the charge pump circuit becomes large. On the other hand, in order to cause the reset circuit to generate this delay time, the inverters of several tens stages become necessary. However, it is difficult to form such inverters of several tens stages on a semiconductor chip since a space is not sufficient. As a result, it becomes difficult to keep the time in which the charge pump output current flows at the time of PLL lock, to the optimum length.

SUMMARY OF THE INVENTION

An object of the present invention is therefore to provide a phase difference—current conversion circuit which can always realize such characteristics that a current flowing through a transistor at a charge pump output stage reaches a set value at the time of PLL lock and is cut off, without increasing an occupied area on a semiconductor chip.

A phase difference—current conversion circuit according to the present invention includes a phase comparator for outputting first and second digital signals one of which has a first level and the other of which has a second level in a case where phases of two input signals do not coincide with each other, and for outputting the first and second digital signals both of which have the first level in a case where the phases of the two input signals coincide with each other; a charge pump circuit for outputting an outflow current only when the first digital signal outputted from the phase comparator is in the first level, and outputting an inflow current only when the second digital signal outputted from the phase comparator is in the first level; and a delay circuit for causing the first and second digital signal outputted from the phase comparator to become the second level after a definite delay time in a case where the phases of the two input signals coincide with each other. The charge pump circuit is provided with a current outputting transistor for gently outputting the outflow current or the inflow current by its rising delay time. The delay circuit is provided with a delay time determining transistor for determining the definite delay time by its rising delay time. The rising delay time of the delay time determining transistor is set equal to the rising delay time of the current outputting transistor.

Since the rising delay time of the current outputting transistor of the charge pump circuit is set equal to the rising delay time of the delay time determining transistor of the delay circuit, even in the case where the delay characteristics of the current outputting transistor are changed by power supply voltage, ambient temperature, manufacturing conditions and the like, the delay characteristics of the delay time determining transistor are also changed in the same way, Because, when compared with the conventional technique, the current outputting transistor and the delay time determining transistor are transistors having the same rising delay time, changing factors of the delay characteristics are common to the charge pump circuit and the delay circuit. By this, such characteristics that an output current of the charge pump circuit reaches a set value and is cut off is always kept.

In order to cause the changes of delay characteristics of the current outputting transistor and the delay time determining transistor to become more coincident with each other, it is preferable to form the delay time determining transistors and the current outputting transistor on the same semiconductor chip, and further, it is most preferable to form them with the same structure on the same semiconductor chip at the same time.

The phase difference—current conversion circuit according to the present invention further adopts the following structure. The current outputting transistor is constituted by a first conductivity type current outputting transistor for outputting the outflow current only when the first digital signal outputted from the phase comparator is in the first level, and a second conductivity type current outputting transistor for outputting the inflow current only when the second digital signal outputted from the phase comparator is in the first level. The delay time determining transistor is constituted by a first conductivity type delay time determining transistor and a second conductivity type delay time determining transistor which are operated by the first and second digital signals outputted from the phase comparator in the case where the phases of the two input signals coincide with each other. The delay circuit is provided with delay time determining means for setting a longer one of a delay time determined by the first conductivity type delay time determining transistor and a delay time determined by the second conductivity type delay time determining transistor to the delay time of the delay circuit.

When a difference occurs in, for example, threshold values between the first and second conductivity type current outputting transistors due to difference in the conductivity type, a difference occurs in the rising delay time as well. At this time, similarly, a difference occurs in the rising delay time in the first and second conductivity type delay time determining transistors as well. On the other hand, the delay time determining means sets a longer one of the delay times determined by the first and second conductivity type delay time determining transistors to the delay time of the delay circuit. Thus, even if one of the first and second conductivity type current outputting transistors is operated, since the delay circuit is always operated in accordance with the slower one, such characteristics that the output current of the charge pump circuit reaches a set value and is cut off are always kept.

The phase difference—current conversion circuit according to the present invention further adopts the following structure. The output signal of the delay circuit to bring the first and second digital signals outputted from the phase comparator in the case where the phases of the two input signals coincide with each other into the second level after the definite delay time is changed from the second level to the first level after the definite delay time when both the first and second digital signals are changed from the second level to the first level, and subsequently, it returns to the second level instantaneously when both the first and second digital signals are changed from the first level to the second level.

When the output signal of the delay circuit is made delayed at, for example, only the rising edge of the input signal and is not delayed at the falling edge, as compared with the case where it is delayed also at the falling edge, the operation of the phase difference—current conversion circuit becomes possible at an about double frequency.

The phase difference—current conversion circuit according to the present invention further adopts the following structure. The delay time determining transistor is provided with a gate capacitance increasing transistor, a gate of the delay time determining transistor is connected to a gate of the capacitance increasing transistor, and a source of the delay time determining transistor is connected to a source and drain of the capacitance increasing transistor.

Since the source and drain of the capacitance increasing transistor are connected to the source of the delay time determining transistor, a drain current does not flow. In addition, since the gate of the capacitance increasing transistor is connected to the gate of the delay time determining transistor, a gate current transiently flows. On the other hand, a rising delay time of a transistor is in proportion to a gate capacitance (product of channel length and channel width), and is in inverse proportion to a steady drain current. Thus, in the delay time determining transistor, the gate capacitance can be substantially adjusted without increasing the drain current. By this, while low consumed electric power is realized, a desired rising delay time can be obtained.

The phase difference—current conversion circuit according to the present invention further adopts the following structure. The delay time determining transistor is designed such that, with respect to the current outputting transistor, providing that k>1, a steady drain current is made 1/k, and a product of a channel length and a channel width is made 1/k.

A rising delay time of a transistor is in proportion to gate capacitance (product of channel length and channel width), and is in inverse proportion to a steady drain current. That is, even if the steady drain current is made 1/k, and the product of the channel length and the channel width is made 1/k, the rising delay time of the transistor is not changed.

Further, low consumed electric power and miniaturization can be realized.

In the above structure, the first level may be a high potential, and the second level may be a low potential, and on the contrary, the first level may be a low potential, and the second level may be a high potential. In addition, the first conductivity type may be a p-channel type and the second conductivity type may be an n-channel type, and on the contrary, the first conductivity type may be an n-channel type, and the second conductivity type may be a p-channel type.

Next, the invention will be described once more using different expression.

(1) The phase difference—current conversion circuit is characterized by having such a circuit structure that even in the case where power supply voltage, ambient temperature, manufacturing conditions, and the like are changed, delay characteristics of the delay circuit used as a reset circuit of the phase comparator is changed at the same ratio as rising delay characteristics of output current of the charge pump circuit. In the present invention, even in the case where power supply voltage, ambient temperature, manufacturing conditions, and the like are changed, it is possible to always keep such characteristics that the current flowing through the transistor of the charge pump output stage at the time of PLL lock reaches a set value and is cut off.

(2) The delay circuit of the phase comparator used in the phase difference—current conversion circuit of the above paragraph (1) is characterized by the following circuit structure. Here, the size of a transistor is defined as a product LW of a channel length L and a channel width W. In addition, a mirror ratio is defined as a ratio (channel length L is constant) of channel widths W of input and output transistors used in a current mirror circuit.

A. As shown in a delay circuit of FIG. 1, there is provided a circuit structure in which a delay of a mirror current of a current mirror circuit constituted by transistors is detected, thereby to obtain a delay time.

Figure 1:
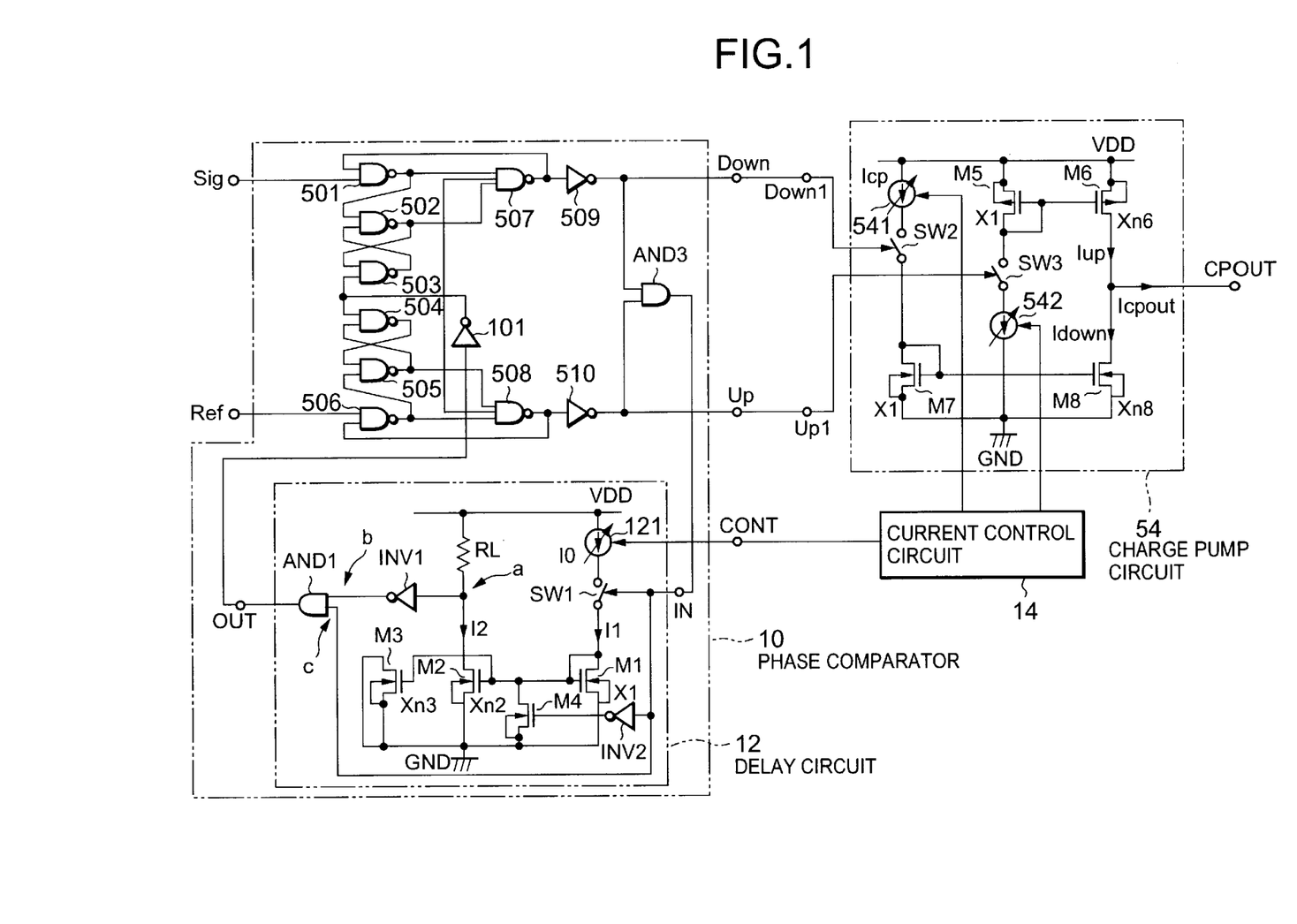
FIG. 1 is a circuit diagram showing a first embodiment of a phase difference—current conversion circuit of the invention.

B. As shown in FIG. 1, a transistor M3 for setting the delay time is connected to transistors M1 and M2 constituting the current mirror circuit of the delay circuit, and a drain of the transistor M3 is connected to GND. By this, delay characteristics comparable to a current mirror circuit having a large mirror ratio are realized without increasing a consumed current. In the current mirror circuit of the delay circuit of FIG. 1, although the ratio of current I1 and I2 becomes 1:n2 (2 of n2 means 2 of the transistor M2, that is, 1:n2 means that the channel width of the transistor M2 is n times as large as that of the transistor M1), the delay time of the mirror current I2 becomes almost equal to that of a current mirror circuit having a mirror ratio of 1:(n2+n3).

C: For the purpose of reducing a mounting area on a semiconductor integrated circuit without increasing a consumed current of the delay circuit while the delay time of the delay circuit and that of the charge pump circuit are kept the same, the circuit of FIG. 1 is made the structure described below. Since the mirror ratio of the current mirror circuit of charge pump output stage transistors M7 and M8 is 1:n8, the mirror ratio of M1, M2, and M3 of the delay circuit is adjusted, and is set so that M1 and (M2+M3) have a mirror ratio of 1:n8. In the case where the size ratio of M1 and M7 is set to 1; k, reference current I0 of the delay circuit is set to 1/k of reference current Icp of the charge pump.

D. The characteristics of the delay circuit of FIG. 1 are made such that only the rising edge of an input signal is delayed, and the falling edge of the delayed signal falls down at the same time as the input signal. In the delay circuit of FIG. 1, AND of the input signal and the signal of the delayed input is taken, so that the characteristics of delaying only the rising edge of the input signal are realized. When the input is changed to the L level by INV2 and M4, electric charges stored in the gate of M1, M2 and M3 are discharged by M4, and the circuit is instantaneously made an off state, so that lowering of a consumed current is realized. Since the delay circuit is made such a structure that the falling edge is not delayed, so compared with the case where the falling edge is also delayed, the phase difference—current conversion circuit can operate at an about double frequency.

E. In FIG. 1, in the case where the reference current Icp of the charge pump is made variable, the reference current IO of the delay circuit is also made to follow this, and is made variable at the same ratio as the reference current of the charge pump. By carrying out this control, even in the case where a set current of the charge pump circuit is made variable, it is possible to keep such characteristics that the current flowing through the transistor of the charge pump output stage at the time of PLL lock reaches a set value and is cut off.

Figure 4:
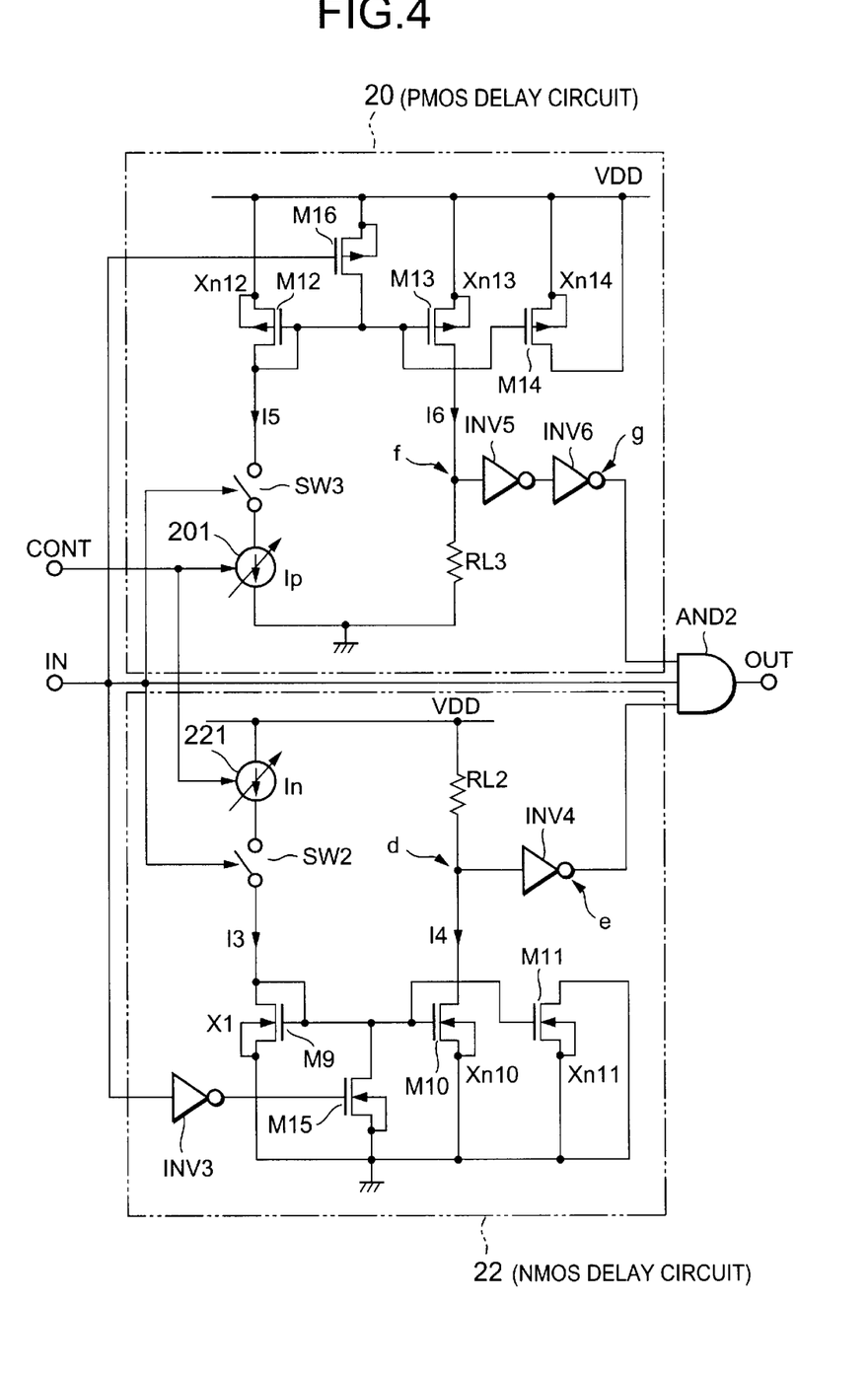
FIG. 4 is a circuit diagram showing a delay circuit of a phase difference—current conversion circuit of the invention.

F. As shown in FIG. 4, a delay circuit is characterized in that a delay circuit of an NMOS mirror circuit and a delay circuit of a PMOS mirror circuit are operated at the same time, and a longer delay time is selected and is outputted. By replacing the delay circuit of the phase difference—current conversion circuit of FIG. 1 with the circuit of FIG. 4, even in the case where threshold voltages of NMOS transistors and PMOS transistors are separately changed, it is possible to realize such characteristics that the current flowing through the transistor of the charge pump output stage at the time of PLL lock reaches a set value, and then, it is cut off.

In the case where the delay circuit of FIG. 1 is replaced with the delay circuit of FIG. 4, for the purpose of reducing a mounting area on a semiconductor integrated circuit without increasing a consumed current of the delay circuit while the delay time of the delay circuit and that of the charge pump circuit are kept the same, the structure described below is adopted. Since the mirror ratio of the current mirror current of M7 and M8 using NMOS transistors of the charge pump circuit shown in FIG. 1 is 1:n8, the mirror ratio of M9, M10, and M11 of the NMOS delay circuit in FIG. 4 is adjusted, and is set so that the mirror ratio of M9 and (M10+M11) becomes 1:n8. Since the mirror ratio of the current mirror circuit of M5 and M6 using the PMOS transistors of the charge pump circuit shown in FIG. 1 is 1:n6, the mirror rate of M12, M13, and M14 of the PMOS delay circuit in FIG. 4 is adjusted and is set so that the mirror ratio of M12 and (M13+M14) becomes 1:n6. In the case where the size ratio of M7 and M9 is set to 1:kn, the reference current In of the NMOS delay circuit is set to 1/kn of the reference current Icp of the charge pump. In the case where the size of ratio of M5 and M12 is set to 1:kp, a reference current Ip of the PMOS delay circuit is set to 1/kp of the reference current of the charge pump.

DETAILED DESCRIPTION OF THE PREFERRED EMBODIMENTS

FIG. 1 is a circuit diagram showing a first embodiment of a phase difference—current conversion circuit of the present invention. Hereinafter, a description will be made with reference to this drawing. However, the same portions as those of FIG. 10 are designated by the same reference characters, and their description is omitted.

A charge pump circuit 54 is a current output type charge pump circuit in which an output stage is constituted by a current mirror circuit. A phase comparator 10 is a digital phase comparator, and includes a terminal Ref to which a reference signal is inputted, a terminal Sig to which a comparison signal is inputted, and terminals Up and Down from which a result of phase comparison is outputted. In addition, the phase comparator includes a terminal IN for outputting a H level to a delay circuit 12 in the case where both the terminals Up and Down become a high state, and a terminal OUT for returning the phase comparator 10 to the initial state by receiving a signal of the H level. The delay circuit 12 delays the rising edge of an input signal of the terminal IN, and outputs this signal to the terminal OUT.

In this embodiment, by setting the delay time of the delay circuit 12 equal to the rising delay time of drain current of transistors M6 and M8 of the output stage of the charge pump circuit 54, there are obtained such characteristics that the current flowing through the transistors M6 and M8 at the time of PLL lock reaches a set value and is cut off. In addition, even in the case where power supply voltage, ambient temperature, manufacturing conditions, and the like are changed, for the purpose of keeping the characteristics that the current flowing through the transistors M6 and M8 of the output stage of the charge pump circuit 54 at the time of PLL lock reaches the set value and is cut off, this embodiment is characterized in that the delay circuit 12 is made to have structures (1) to (5) described below. Here, the size of a transistor used below is defined as a product LW of a channel length L and a channel width W. A mirror ratio is defined as a ratio (channel length L is made constant) of channel widths w of transistors used in a current mirror circuit.

(1) A delay of mirror current of the current mirror circuit constituted by the transistors is detected, and a delay time is obtained by this.

(2) A transistor M3 for setting a delay time is connected to transistors M1 and M2 constituting the current mirror circuit of the delay circuit 12, and a drain of the transistor M3 is connected to ground CND.

In addition, for the purpose of reducing an occupied area on a semiconductor integrated circuit without increasing a consumed current, the structure described below is adopted.

(3) Since the mirror ratio of the current mirror circuit of the transistors M7 and M8 of the output stage of the charge pump circuit 54 is 1:n8, the mirror ratio of the transistors M1, M2 and M3 of the delay circuit 12 is adjusted, and is set so that M1 and (M2+M3) come to have a mirror ratio of 1:n8. (4) In the case where the size ratio of the transistors M1 and M7 is set to 1:k, a reference current IO of the delay circuit 12 is set to 1/k of a reference current Icp of the charge pump circuit 54. (5) The delay circuit 12 is constructed to have such characteristics that only the rising edge of an input signal is delayed, and the falling edge falls down at the same time as the input signal.

In the delay circuit 12, by obtaining a logical product of an input signal and a signal of a delayed input signal through an AND gate AND3, such characteristics that only the rising edge of the input signal is delayed is realized. When the input signal of the terminal IN is changed to the L level, electric charges stored in gates of the transistors M1, M2 and M3 are discharged through an inverter INV2 and a transistor M4, so that the transistor M1 and M2 are instantaneously made an off state. By this, lowering of a consumed current is realized.

Besides, this embodiment is made to have such a structure that in the case where the reference current Icp of the charge pump circuit 54 is changed by a current control circuit 14, the reference current IO of the mirror circuit for setting the delay time of the delay circuit 12 is also made to follow this, so that the reference current IO and the set current Icp are changed at the same ratio.

Figure 2:
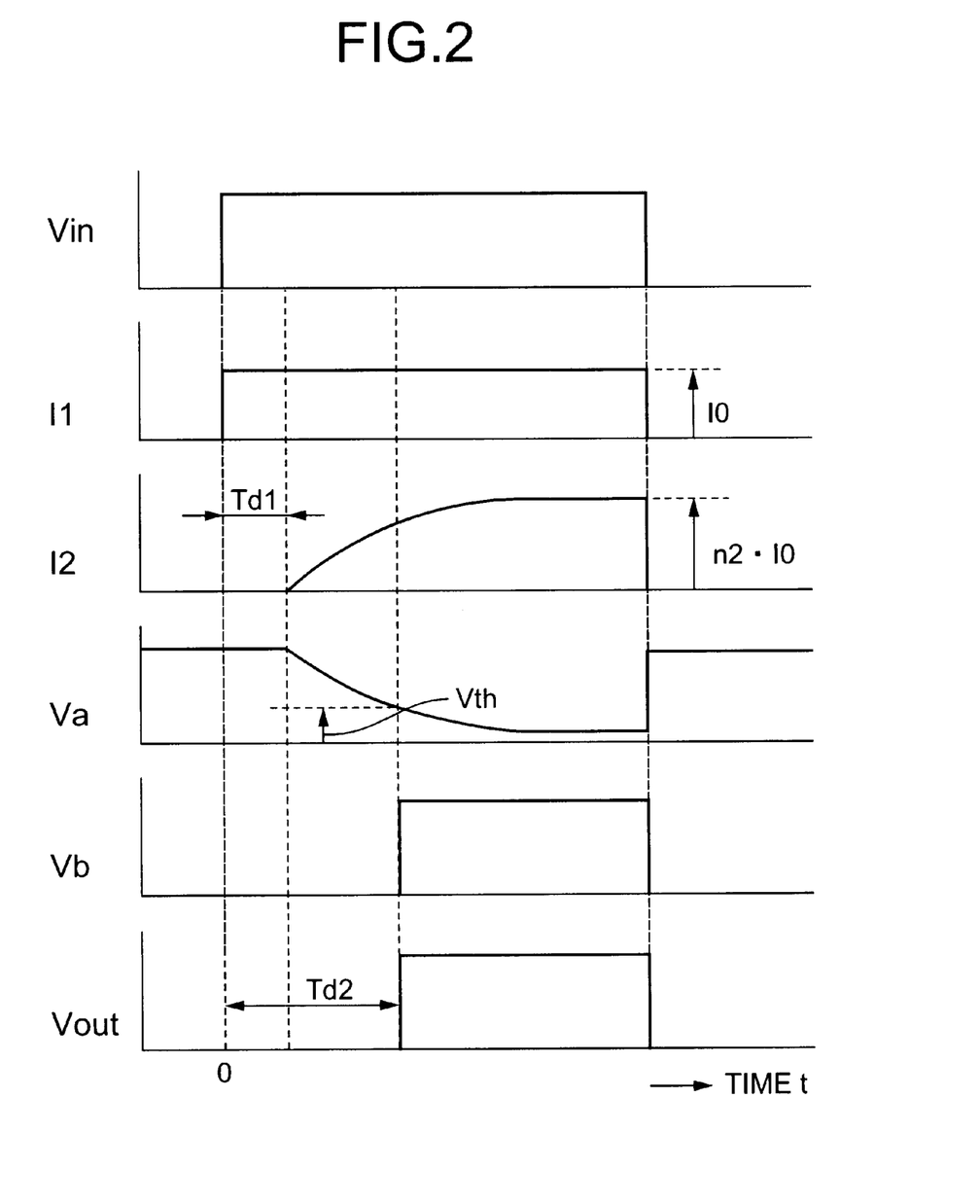
FIG. 2 is a waveform diagram showing the operation of a delay circuit in the phase difference—current conversion circuit of FIG. 1.

FIG. 2 is a waveform diagram showing the operation of the delay circuit in the phase difference—current conversion circuit of this embodiment. Hereinafter, the operation of the delay circuit 12 will be described with reference to FIG. 1 and FIG. 2.

First, when a voltage Vin of the H level is inputted to the terminal IN at time 0, a current I2 starts to flow after a delay of a time Td1 in which a channel between the drain and source of the transistor M1, M2 is formed. Then, a voltage Va at point a of the input side of the inverter INV1 is gradually decreased in accordance with increase of the current I2, and eventually, reaches a threshold voltage Vth. Then, a voltage Vb at point b of the output side of the inverter INV1 is changed to the H level, and both potentials at points c and b of the input side of the AND gate AND1 receiving this become the H level. Thus, a voltage Vout of the terminal OUT of the delay circuit 12 is changed to the H level after a delay of a time Td2 from the rising edge of the voltage Vin.

Next, in the case where the voltage Vin is changed from the H level to the L level, since one (point c) at the input side of the AND gate AND1 becomes the L level, the voltage Vout of the terminal OUT of the delay circuit 12 is changed to the L level synchronously with the voltage Vin. When the voltage Vin is changed from the H level to the L level, since the output signal of the inverter INV2 becomes the H level, a portion between the drain and source of the transistor M4 becomes an on state, so that electric charges stored in the gates of the transistors M1, M2 and M3 are instantaneously discharged. Thus, in the delay circuit 12, the current I1, I2 does not flow during the period when the L level is inputted, and the circuit is an off state.

As described above, the delay circuit 12 has such characteristics that only the rising edge of the input signal is delayed, and the falling edge is not delayed.

Figure 3:
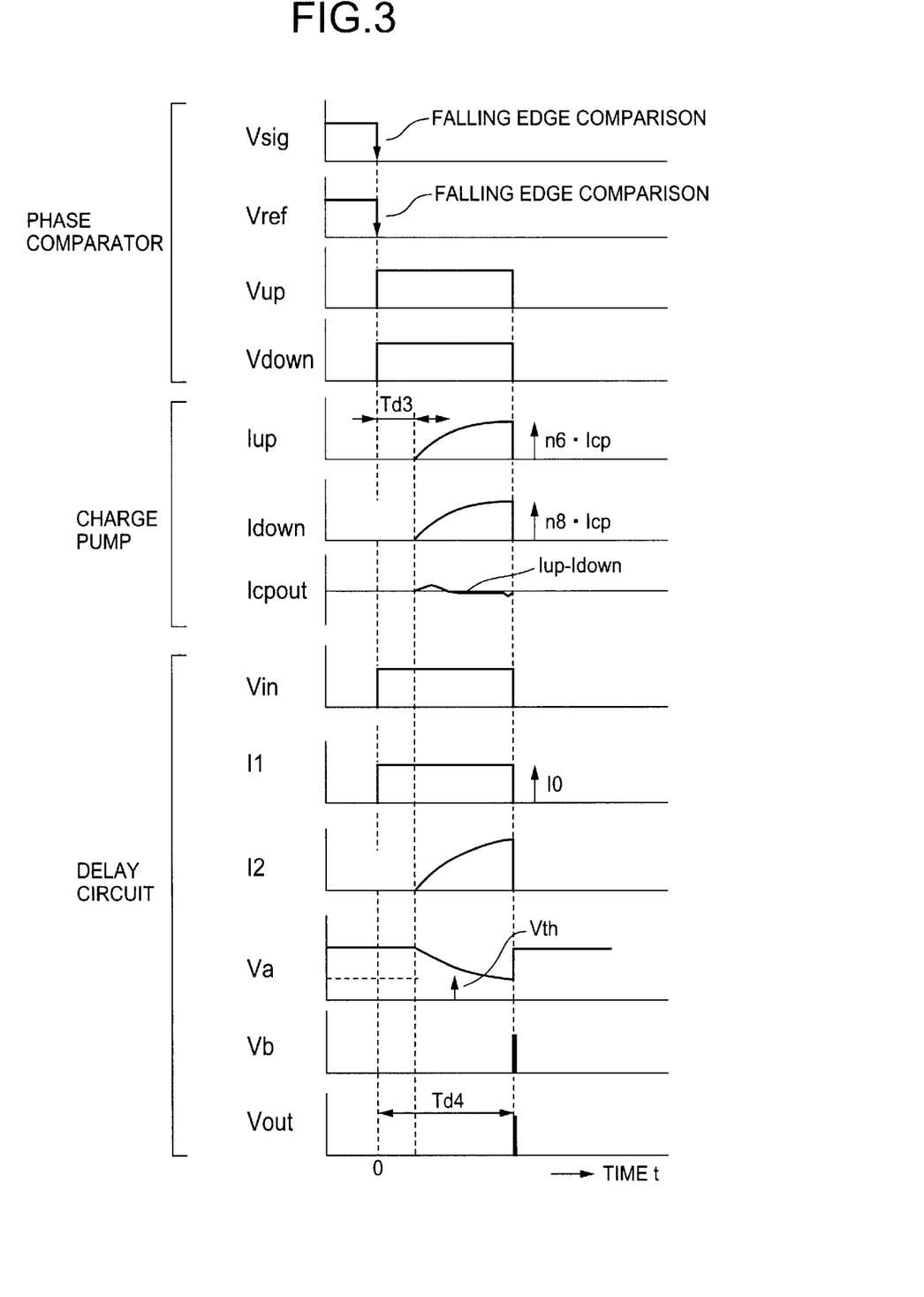
FIG. 3 is a waveform view showing the operation of the phase difference—current conversion circuit of FIG. 1.

FIG. 3 is a waveform diagram showing the operation of the phase difference—current conversion circuit of this embodiment. Hereinafter, the operation of the phase difference—current conversion circuit of this embodiment will be described with reference to FIG. 1 and FIG. 3.

FIG. 3 shows an operation waveform of the phase difference—current conversion circuit of FIG. 1 when the PLL is locked. The phase comparator 10 is a digital phase comparator for performing phase comparison at the falling edge of an input signal. In the phase comparator 10, input signals of the terminals Sig and Ref simultaneously fall down at time 0, and by this, voltages vup and Vdown of the terminals Up and Down become the H level simultaneously, and the terminal IN (input terminal of the delay circuit 12) at the output side of the AND gate AND 3 is changed to the H level.

In the charge pump circuit 54, when the voltage Vup becomes the H level, the electric switch SW3 is turned on, and a current Iup starts to flow through the transistor M6 after a delay of time Td3 in which the channel of the transistors M5 and M6 is formed. The current Iup is increased up to a set current n6·Icp. When the voltage Vdown becomes the H level, the electric switch SW2 of the charge pump circuit 54 is turned on, and a current Idown starts to flow down through the transistor M8 after a delay of time T3 in which the channel of the transistors M7 and M8 is formed. The current Idown is increased up to a set current n8·Icp. An output current Icpout of the charge pump circuit 54 is a difference between the currents Iup and Idown. In the case where the phase difference—current conversion circuit of this embodiment actually operates in a PLL circuit, the system becomes stable at a phase difference of the input signals where an average value of the output current Icpout becomes 0.

In the delay circuit 12, when the terminal IN is changed to the H level, the electric switch SW1 is turned on, and the current I2 starts to flow after a delay of the time Td3 in which the channel of the transistors M1 and M2 is formed. Then, the voltage Va at the point a is gradually decreased as the current I2 is increased, and eventually, the voltage Va reaches the threshold voltage Vth of the inverter INV1. Then, at the AND gate AND1, the voltage Vb at the point b of the input side is changed to the H level, and since the voltage Vc at the point c of the input side is also the H level, the voltage Vout at the terminal OUT of the output side is changed to the H level.

When the terminal OUT of the delay circuit 12 is changed to the H level, the phase comparator 10 is reset by receiving this. That is, the terminals Up and Down are changed to the L level, the electric switches SW2 and SW3 are turned off, and the currents Iup and Idown in the charge pump circuit 54 are turned off. The terminal IN of the AND gate AND3 is also changed to the L level, and the terminal OUT of the delay circuit 12 is also changed to the L level at the same time.

Like this, the delay time Td4 of the delay circuit 12 is set equal to the time from the point when the voltages vup and vdown are outputted to the point when the currents Iup and Idown of the charge pump circuit 54 reach the set currents n6·Icp and n8·Icp. By this, there are realized such characteristics that the currents Iup and Idown flowing through the transistors M6 and M8 of the output stage of the charge pump circuit 54 reach the set currents and are cut off.

In this embodiment, since the delay circuit 12 is made to have the foregoing structure, even in the case where power supply voltage, ambient temperature, manufacturing conditions, and the like are changed, the current rising delay time of the charge pump circuit 54 and the delay time of the delay circuit 12 are changed at the same ratio. Thus, it is possible to always keep such characteristics that after the current flowing through the transistor of the output stage of the charge pump circuit 54 at the time of PLL lock reaches the set value, it is cut off.

If the delay time Td4 of the delay circuit 12 shown in FIG. 3 has such characteristics that the currents Iup and Idown are cut off before they reach the set currents n6·Icp and n8·Icp, this becomes equivalent to the case where the value of the reference current Icp is set apparently small in the state where the PLL is locked, that is, the phase difference—current conversion gain of the charge pump circuit 54 is lowered. The lowering of the phase difference—current conversion gain of the charge pump circuit 54 may cause the behavior, characteristics, and the like of the PLL circuit to be inconsistent with theory, or may cause C/N to be deteriorated by lowering of a noise suppression effect. If the delay time Td4 of the delay circuit 12 becomes longer than the time shown in FIG. 3, since the power of a reference frequency component appearing in the output of the charge pump circuit 54 becomes large in proportion to the delay time Td4, the reference frequency component observed to the PLL output is increased, which becomes the cause of deterioration of the C/N.

FIG. 4 is a circuit diagram showing a delay circuit in a phase difference—current conversion circuit of a second embodiment of the present invention.

The structure of the delay circuit shown in FIG. 1 has such defects that in the case where the threshold voltages of the NMOS transistor and the PMOS transistor are separately changed from the center condition, there appear such characteristics that the current Iup and Idown are cut off before reaching the set values at the time of PLL lock, or such characteristics that even after the currents Iup and Idown reach the set values, they continues to flow. This is because the delay time is formed by only the current mirror circuit composed of the NMOS transistors in the delay circuit of FIG. 1, while the output stage of the charge pump circuit is constructed by a combination of the current mirror circuit composed of the PMOS transistors and the current mirror circuit composed of the NMOS transistors. In order to compensate the foregoing defects, the delay circuit shown in FIG. 4 is characterized in that it is made to have the following structure.

The delay circuit is characterized in that a PMOS delay circuit 20 of a mirror circuit composed of PMOS transistors and an NMOS delay circuit 22 of a mirror circuit composed of NMOS transistors are simultaneously operated and a longer delay time is selected. The logical product of the output signal of the PMOS delay circuit 20, the output signal of the NMOS delay circuit 22, and the input signal from a terminal IN is obtained by an AND gate AND2, so that there are realized such characteristics that only the rising edge is delayed and the falling edge falls down synchronously with the input signal of the terminal IN.

In the case where the delay circuit in FIG. 1 is replaced by the delay circuit of FIG. 4, for the purpose of reducing an occupied area on a semiconductor integrated circuit without increasing a consumed current of the delay circuit while the delay time of the delay circuit and that of the charge pump circuit are kept identical to each other, the structure described below is adopted.

Since the mirror ratio of the current mirror circuit composed of the NMOS transistors M7 and M8 of the charge pump circuit 54 shown in FIG. 1 is 1:n8, the mirror ratio of transistors M9, M10, and M11 of the NMOS delay circuit 22 is adjusted, and is set so that the mirror ratio of M9 and (M10+M11) becomes 1:n8.

Since the mirror ratio of the current mirror circuit made of the PMOS transistors M5 and M6 of the charge pump circuit shown in FIG. 1 is 1:n6, the mirror ratio of transistors M12, M13 and M14 of the PMOS delay circuit 20 is adjusted, and is set so that the mirror ratio of M12 and (M13+M14) become 1:n6.

In the case where the size ratio of the transistors M7 and M9 is set to 1:kn, a reference current In of the NMOS delay circuit 22 is set to 1/kn of the reference current Icp of charge pump circuit. In the case where the size ratio of the transistors M5 and M12 is set to 1:kp, a reference current Ip of the PMOS delay circuit 20 is set to 1/kp of the reference current Icp of the charge pump circuit.

Figure 5:
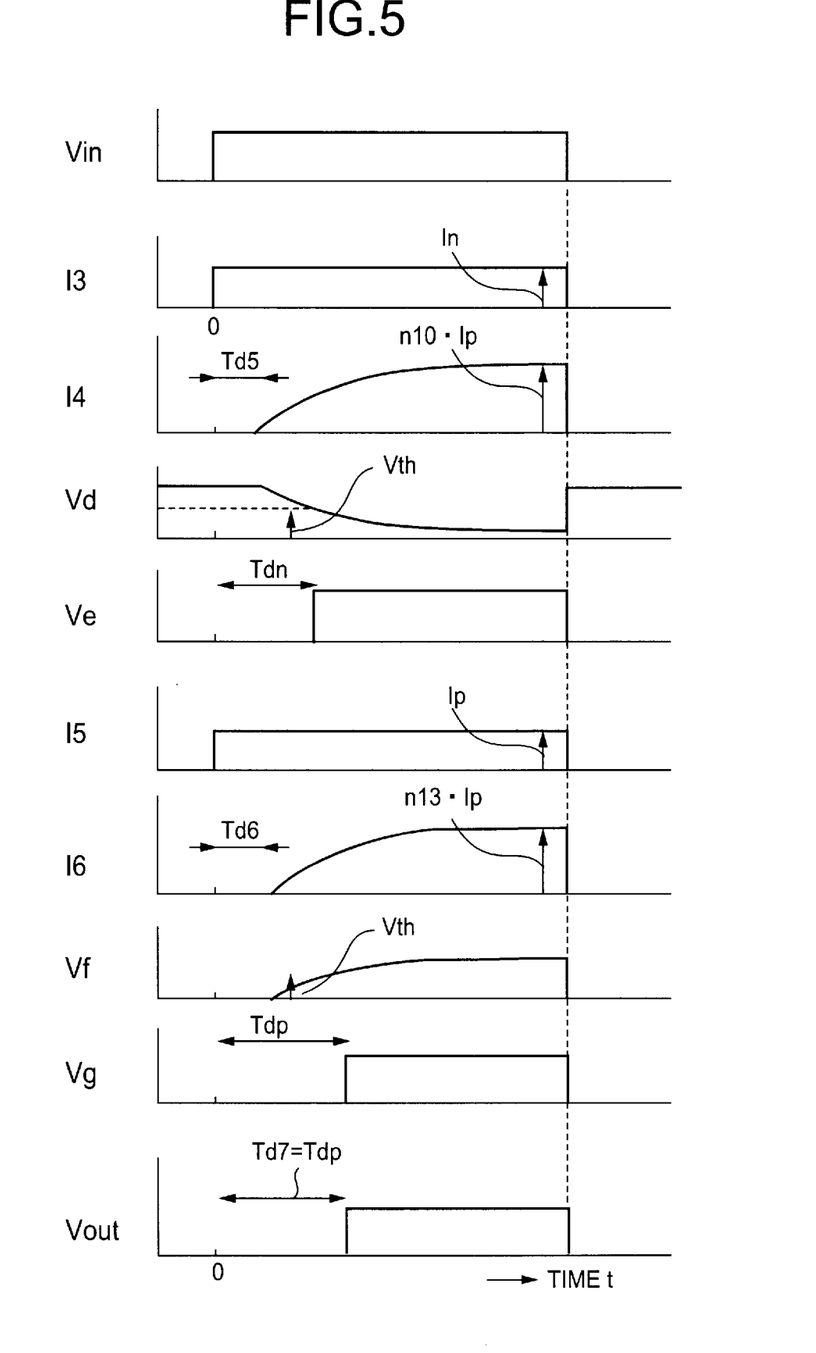
FIG. 5 is a waveform diagram showing the operation of the delay circuit of FIG. 4.

FIG. 5 is a waveform diagram showing the operation of the delay circuit in the phase difference—current conversion circuit of this embodiment. Hereinafter, the operation of the delay circuit will be described with reference to FIG. 4 and FIG. 5. Although the delay time Tdn of the NMOS delay circuit 22 is set equal to the delay time Tdp of the PMOS delay circuit 20 by design of the center condition, FIG. 5 shows the operation waveform in the case where the threshold voltage of the NMOS transistor is changed to a low value and the threshold voltage of the PMOS transistor is changed to a high value by manufacturing conditions.

First, the operation of the NMOS delay circuit 22 will be described. When a voltage Vin of the H level is inputted to the terminal IN at time 0, a current I4 starts to flow after a delay of a time Td5 in which a channel between a drain and a source of the NMOS transistor M9, M10 is formed. A voltage Vd at point d is gradually decreased as the current I4 is increased, and eventually, it reaches a threshold voltage Vth of an inverter INV4. Then, a voltage Vc at point e of the output side of the inverter INV4 is changed to the H level after a delay a time Tdn from the voltage Vin.

Next, the operation of the PMOS delay circuit 20 will be described. When the voltage Vin of the H level is inputted to the terminal IN at time 0, a current I6 starts to flow after a delay of time Td6 in which a channel between a drain and a source of the PMOS transistors M12 and M13 is formed. A potential Vf at point f is gradually increased as a current I6 is increased, and eventually, it reaches a threshold voltage Vth of an inverter INV5. Then, an output signal of the inverter INV5 becomes the L level, and a voltage Vg at point g of the output side of an inverter INV6 to which this is inputted is changed to the H level after a delay of time Tdp.

Since the voltages at the terminal IN, the point e, and the point g are inputted, the output signal of the AND gate AND2 is changed to the H level at the point of time when both the voltages at the points e and g become the H level after the voltage of the H level is inputted to the terminal IN. That is, a longer one of the delay time Tdp of the delay circuit 20 using the PMOS transistors and the delay time Tdn of the delay circuit 22 using the NMOS transistors becomes the delay time. When the voltage at the terminal IN is changed to the L level, since the output signal of the AND gate AND 2 is also changed to the L level, the falling edges of the output signal of the delay circuits 20 and 22 falls down synchronously with the input signal.

By substituting the delay circuit having the foregoing structure for the delay circuit shown in FIG. 1, even in the case where the threshold voltages of the NMOS transistor and the PMOS transistor are separately changed, it is possible to realize such characteristics that the current flowing through the transistor of the charge pump output stage at the time of PLL lock reaches a set value, and then, it is cut off.

Figure 6:
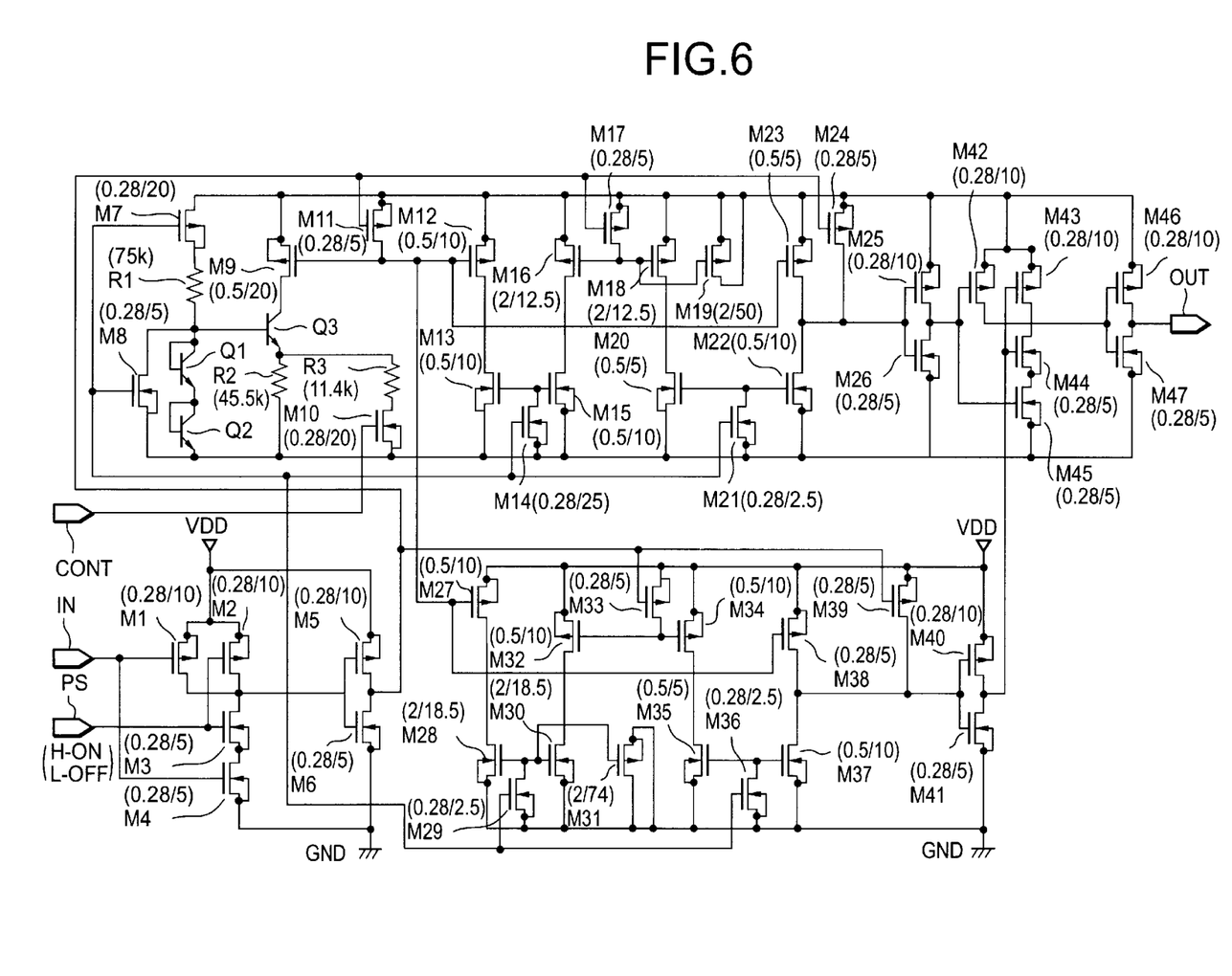
FIG. 6 is a circuit diagram showing an embodiment of the delay circuit of FIG. 4.

FIG. 6 is a circuit diagram showing an embodiment of the delay circuit of FIG. 4. Hereinafter, a description will be made with reference to this drawing.

Reference character IN designates an input and reference character OUT designates an output. There is provided such a function that by a signal of the L or H level inputted to a terminal CONT, a current of a reference current source circuit constituted by transistors M10, Q1 to Q3, and R1 to R3 is made variable at the same ratio as a current source of the charge pump circuit, so that the delay time can be adjusted in two stages. Reference character PS designates a power save terminal, and a circuit is operated at the H level. A circuit forming the delay time is a current mirror circuit composed of transistors M16, M18, and M19, and a current mirror circuit composed of transistors M28, M30 and M31, which respectively correspond to the PMOS transistors M12, M13, and M14 and the NMOS transistors M9, M10, and M11 of FIG. 4. Incidentally, a parenthesis in the drawing designates (L/W). Besides, in FIG. 6, for convenience, the same reference characters are given to even the portions different from FIG. 1.

Figure 7:
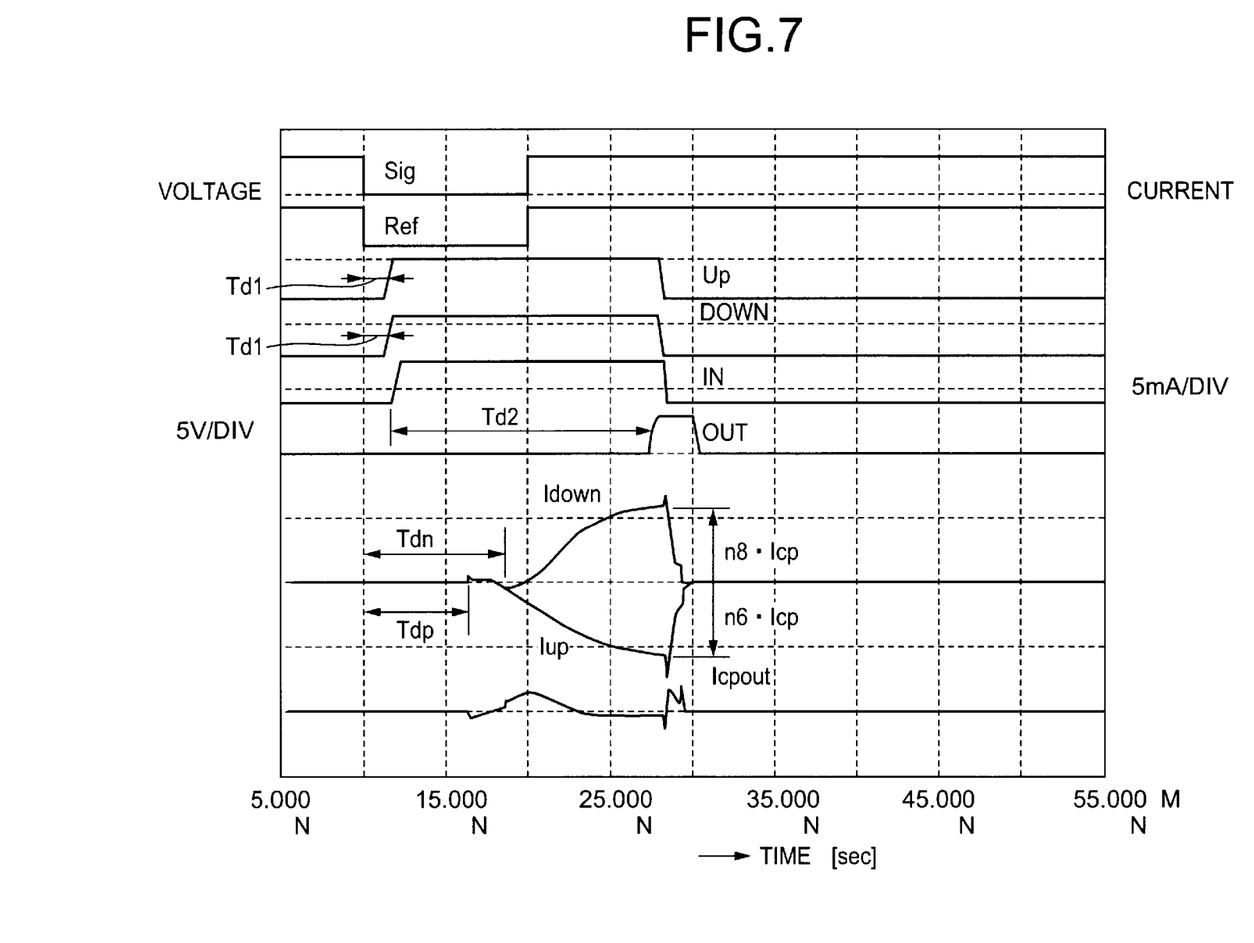
FIG. 7 is a waveform diagram showing a first example (charge pump delay: type condition) of simulation results of the phase difference—current conversion circuit including the delay circuit of FIG. 6.

FIG. 7 is a waveform diagram showing a first example of results of simulation by SPICE (simulation program with integrated circuit emphasis) where the delay circuit of FIG. 1 is replaced with the delay circuit of the embodiment shown in FIG. 6. Hereinafter, a description will be made with reference to FIG. 1 and FIG. 7. The conditions of the simulation are such that VDD is 3. 0 V, junction temperature Tj is 25 C., and manufacturing condition of an element is center condition. The setting of the charge pump circuit 54 of FIG. 1 is such that the channel length L of the transistors M5 to M8 is 1.5 m, the channel width W of the transistors M6 and M8 is 2100 m, the respective mirror ratios of the transistors M5 and M6 and the transistors M7 and M8 are 1:5, and the reference current Icp is 1.2 mA. The result shown in the drawing is obtained by simulation for a pseudo state where PLL is locked, and here, as signals corresponding to the time of PLL lock, signals falling down at the same time are inputted to the terminals Sig and Ref of the phase comparator 10.

In FIG. 7, first, the falling signals are inputted to the terminals Sig and Ref of the phase comparator 10 at the same timing, and the terminal Up and Down become the H level at the same time after a delay of the time Td1. In the charge pump circuit 54 receiving the signals inputted from the terminals Up and Down, the current Iup as a drain current of the PMOS transistors M6 of the output stage starts to flow after a delay of the time Tdp, and the current Idown as a drain current of the NMOS transistor M8 starts to flow after a delay of the time Tdn. The currents Iup and Idown are gradually increased, through a time constant determined by the reference current Icp of the charge pump circuit 54 and the gate capacitance of the output stage mirror circuit, up to the value of n6·Icp, n8·Icp (n6=n8=5) current mirror ratio times as large as the reference current Icp. In FIG. 7, with respect to the current Iup, since the drain current of the transistor M6 is monitored, the polarity of the current Iup in FIG. 1 and the polarity of the current Iup in FIG. 7 are inverted.

The delay time Td2 of the delay circuit 12 is set so that the rising edge of the input signal from the terminal IN is delayed until the time when the currents Iup and Idown reach the value mirror ratio times as large as the reference current Icp. Thus, at the point of time when the currents Iup and Idown of the charge pump circuit 54 at the time of operation reach the value mirror ratio times as large as the reference current Icp, the output signal from the terminal OUT as a reset signal of the phase comparator 10 is changed to the H level, the terminals Up and Down are changed to the L level, and the current Iup and Idown are turned off.

In FIG. 7, in the case where the delay time Td2 of the delay circuit 12 is shorter than the time shown in FIG. 7, since the currents Iup and Idown are cut off before they reach the value mirror ratio times as large as the reference current Icp, this case is equivalent to the case where the value of the reference current Icp is set apparently small in the state where the PLL loop is locked, that is, the phase difference—current conversion gain of the charge pump circuit 54 is lowered. The lowering of the phase difference—current conversion gain of the charge pump circuit 54 becomes a cause of inconsistency between the behavior of the PLL circuit and a theory, or a cause of C/N deterioration due to lowering of a noise suppression effect.

If the delay time Td2 of the delay circuit becomes longer than the time shown in FIG. 7, the power of a reference frequency appearing in the charge pump output becomes large in proportion to the period of the time Td2. Thus, the reference frequency component observed in the PLL output is increased, which also becomes a cause of C/N deterioration.

Figure 8:
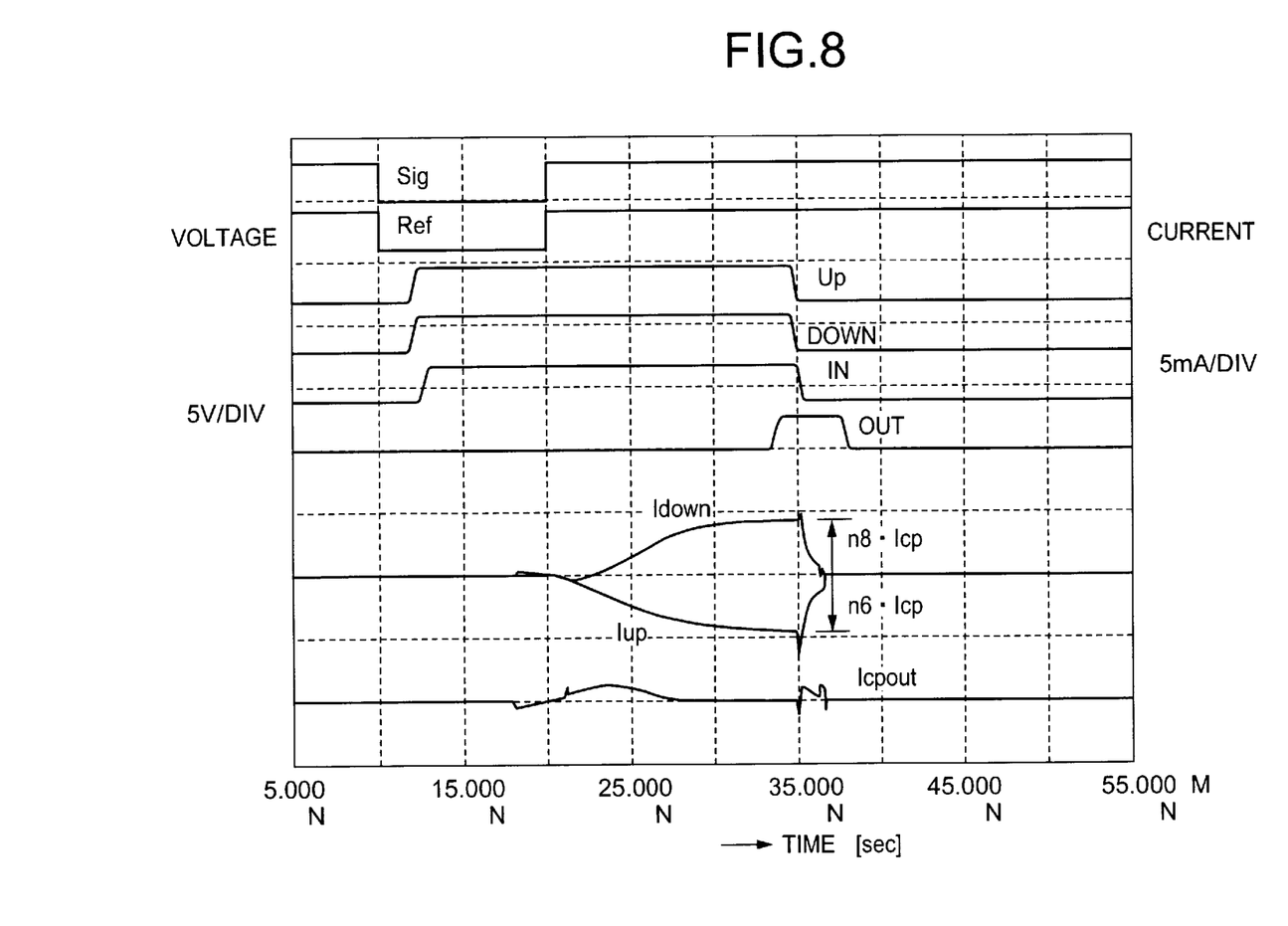
FIG. 8 is a waveform diagram showing a second example (charge pump delay: max condition) of simulation results of the phase difference—current conversion circuit including the delay circuit of FIG. 6.

FIG. 8 is a waveform diagram showing a second example of results of simulation by the SPICE in which the delay circuit of FIG. 1 is replaced with the delay circuit of the embodiment shown in FIG. 6. Hereinafter, a description will be made with reference to this drawing.

In FIG. 8, conditions are changed from the simulation shown in FIG. 7. The conditions are such that power supply voltage VDD is 2.7 V, junction temperature Tj is 85° C., a bipolar transistor has a center condition, a threshold voltage Vt of a transistor is high, and resistance and capacitance are set +20%.

In FIG. 8, although power supply voltage, ambient temperature, and manufacturing condition are changed from the simulation result shown in FIG. 7, since the current structure is such that in the delay time of the delay circuit is changed at the same ratio as the change of the delay time of the charge pump circuit, there are realized such characteristics that the current Iup and Idown reach the values of set values n6·Icp and n8·Icp and are cut off. That is, even in the case where the conditions are changed, such characteristics that the current Iup and Idown of the charge pump circuit at the time of PLL lock reach the set value and are cut off are kept.

Figure 9:
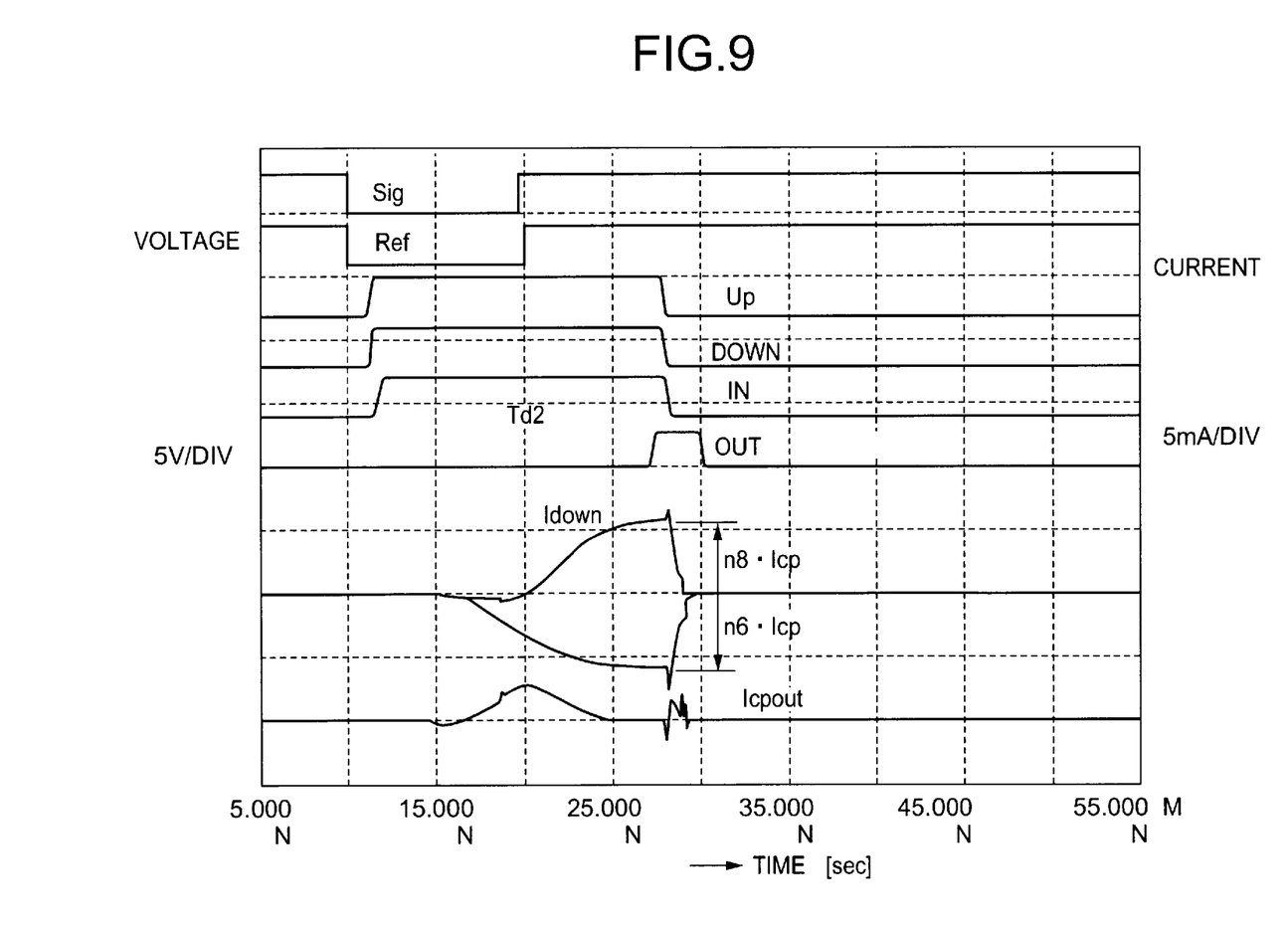
FIG. 9 is a waveform diagram showing a third example (Vtn=H, Vtp=L condition) of simulation results of the phase difference—current conversion circuit including the delay circuit of FIG. 6.

FIG. 9 is a waveform diagram showing a third example of results of simulation by the SPICE in which the delay circuit of FIG. 1 is replaced with the delay circuit of the embodiment shown in FIG. 6. Hereinafter, a description will be made with reference to this drawing.

In FIG. 9, the conditions are changed from the simulation shown in FIG. 7. In FIG. 9, the threshold voltage of the NMOS transistor is set high, and the threshold voltage of the PMOS transistor is set low. Since the structure of the delay circuit is made such that a longer delay time of the PMOS delay circuit and the NMOS delay circuit is selected and is outputted, even in the case where the threshold voltages of the NMOS transistor and the PMOS transistor are separately changed, there are realized such characteristics that the current flowing through the transistor of the charge pump output stage at the time of PLL lock reaches a set value and is cut off.

As described above, the present invention has the following effects.

According to the phase difference—current conversion circuit of the invention, since the rising delay time of the current outputting transistor of the charge pump circuit is set equal to the rising delay time of the delay time determining transistor of the delay circuit, even in the case where the delay characteristics of the current outputting transistor are changed by power supply voltage, ambient temperature, manufacturing condition, and the like, the delay characteristics of the delay time determining transistor can be changed in the same way. By this, it is possible to always keep the characteristics that the output current of the charge pump circuit reaches a set value and is cut off.

According to the phase difference—current conversion circuit of the invention, since the delay time determining transistor and the current outputting transistor are formed on the same semiconductor chip, it is possible to make the changes of the delay characteristics of the current outputting transistor and the delay time determining transistor further coincident with each other.

According to the phase difference—current conversion circuit of the invention, since the delay time determining transistor and the current outputting transistor are formed with the same structure on the same semiconductor chip at the same time, it is possible to make the changes of the delay characteristics of the current outputting transistor and the delay time determining transistor further coincident with each other.

According to the phase difference—current conversion circuit of the invention, the current outputting transistor is constituted by first and second conductivity type current outputting transistors, the delay time determining transistor is constituted by first and second conductivity type delay time determining transistors, and a longer one of delay times determined by the first and second conductivity type delay time determining transistors is made a delay time of the delay circuit, so that, even if a difference of the rising delay time is produced in the first and second conductivity type current outputting transistors, it is possible to always keep the characteristics that the output current of the charge pump circuit reaches a set value and is cut off.

According to the phase difference—current conversion circuit of the invention, since the output signal of the delay circuit is such that for example, only the rising edge of the input signal is delayed and the falling edge is not delayed, so that, as compared with the case where the falling edge is also delayed, the operation can be made at an about double frequency.

According to the phase difference—current conversion circuit of the invention, the gate of the delay time determining transistor is connected to the gate of the capacitance increasing transistor, and the source of the delay time determining transistor is connected to the source and drain of the capacitance increasing transistor, so that gate capacitance can be substantially adjusted without increasing a drain current with respect to the delay time determining transistor. By this, a desired rising delay time can be obtained while low consumed electric power is realized.

According to the phase difference—current conversion circuit of the invention, with respect to the current outputting transistor, since the delay time determining transistor is designed such that the steady drain current is made 1/k, and the product of the channel length and channel width is made 1/k, the rising delay time of the delay time determining transistor can be made identical to the current outputting transistor, so that it is possible to realize low consumed electric power and miniaturization.

What is claimed is:

1. A conversion circuit, comprising:
   a phase comparator for outputting first and second digital signals one of which has a first level and the other of which has a second level in a case where phases of two input signals do not coincide with each other, and for outputting the first and second digital signals both of which have the first level in a case where the phases of the two input signals coincide with each other;
   a charge pump circuit for outputting an outflow current when the first digital signal outputted from the phase comparator is in the first level, and for outputting an inflow current when the second digital signal outputted from the phase comparator is in the first level; and
   a delay circuit for causing the first and second digital signals outputted from the phase comparator to become the second level after a first delay time in a case where the phases of the two input signals coincide with each other.
   the charge pump circuit including a first transistor circuit for outputting one of the outflow current and the inflow current by a second delay time.
   the delay circuit includes a second transistor circuit for determining the first delay time,
   the second delay time being substantially equal to the first delay time, and
   the delay circuit including a third transistor , said third transistor having a gate connected to said gate of said second transistor, and a source/drain path connected to a source of said second transistor.

2. The conversion circuit according to claim 1, wherein the first and second transistors are formed on a same semiconductor chip.

3. The conversion circuit according to claim 1, wherein the first and second transistors are simultaneously formed with a same structure on a same semiconductor chip.

4. A conversion circuit according to claim 1, wherein:
   the first transistor circuit includes a first conductivity type current outputting transistor for outputting the outflow current only when the first digital signal outputted from the phase comparator is in the first level, and a second conductivity type current outputting transistor for outputting the inflow current only when the second digital signal outputted from the phase comparator is in the first level,
   the delay time determining second transistor circuit includes a first conductivity type delay time determining transistor and a second conductivity type delay time determining transistor which are operated by the first and second digital signals outputted from the phase comparator in the case where the phases of the two input signals coincide with each other; and
   the delay circuit includes delay time determining means for setting, as the delay time of the delay circuit, a longer one of a delay time determined by the first conductivity type delay time determining transistor and a delay time determined by the second conductivity type delay time determining transistor.

5. A conversion circuit according to claim 4, wherein the first conductivity type is a p-channel type and is the second conductivity type is an n-channel type.

6. A conversion circuit according to claim 4, wherein the first conductivity type is an n-channel type, and the second conductivity type is a p-channel type.

7. A conversion circuit according to claim 1, wherein the output signal of the delay circuit to bring the first and second digital signals inputted from the phase comparator in the case where the phases of the two input signals coincide with each other into the second level after the definite delay time is changed from the second level to the first level after the definite delay time when both the first and second digital signals are changed from the second level to the first level, and subsequently, it returns to the second level instantaneously when both the first and second digital signals are changed from the first level to the second level.

8. A conversion circuit according to claim 6, wherein the first level is a low potential, and the second level is a high potential.

9. A conversion circuit comprising:
   a phase comparator which responds to the phase difference between a first input signal and a second input signal to output an output signal; and
   a charge pump circuit which responds to the output signal to output a charge pump signal, said charge pump circuit including a first current mirror circuit which has a first input node receiving said output signal and a first output node outputting said charge pump signal;
   wherein said phase comparator includes a delay circuit for receiving said output signal and resetting said output signal,
   said delay circuit comprises a second current mirror circuit which as a second input node receiving said output signal and a second output node outputting a reset signal to reset said output signal.

10. A conversion circuit comprising:
    a phase comparator which responds to the phase difference between a first input signal and a second input signal to output an output signal, said output signal including a first digital signal and a second digital signal; and
    a charge pump circuit which responds to the output signal to output a charge pump signal, said charge pump circuit including a first current mirror circuit which produces a first current path between a first power source line and a charge pump output terminal outputting said charge pump signal in response to said first digital signal;
    said charge pump circuit including a second current mirror circuit which produces a second current path between a second power source line and said charge pump output terminal in response to said second digital signal;
    wherein said phase comparator includes a delay circuit for receiving said output signal and resetting said output signal, and delay circuit including a third current mirror circuit which produces a reset signal to reset and output signal in response to said first and second digital signals.

11. A conversion circuit comprising:
    a phase comparator which receives a first input signal and a second input signal and produces a first output signal, a second output signal, and a third output signal produced from said first output signal and said second output signal;
    a charge pump circuit which comprises an output terminal, a first current mirror circuit, and a second circuit mirror circuit, said first current mirror current which produces a first current path between a first power source line and said output terminal in response to said first output signal;

said second current mirror circuit which produces a second current path between a second power source line and said output terminal in response to said second output signal; and a delay circuit including a third current mirror circuit having an input node receiving said third output signal and an output node, said delay circuit including a logic gate receiving said third output signal and a signal outputted from said output node to produce a reset signal for resetting said first and second output signal.

12. The conversion circuit as claimed in claim 11, wherein said third current mirror circuit comprises:

a first transistor coupled between said input node and said second power source line and having a first control electrode coupled to said input node;

a second transistor coupled between said output node and said second power source line and having a second control electrode coupled to said first control electrode; and a capacitor coupled between said second control electrode and said second power source line.

13. The conversion circuit as claimed in claim 12, wherein said capacitor is a capacitor connected transistor.

14. The conversion circuit as claimed in claim 13, wherein a current mirror ratio of said first current mirror circuit is the same as that of said third current mirror circuit.

15. A conversion circuit comprising:

a phase comparator which responds to phase difference between a first input signal and a second input signal to out first and second output signals; and a charge pump circuit which responds to said first and second output signals to output a charge pump signal;

wherein said phase comparator includes a reset circuit for setting levels of said first and second output signals into first logic levels in response to a first control signal after said levels of said first and second output signals become equal to second logic levels, respectively, said reset circuit includes, a first logic gate receiving first and second output signals to output a second control signal, a delay circuit delaying said second control signal to produce a third control signal, and a second logic gate receiving said second and third control signals to output said first control signal.

16. The conversion circuit as claimed in claim 15, wherein said second logic gate changes its level of said first control signal in response to level change of said third control signal without responding to level change of said second control signal when said second control signal changes from a first logical level to a second logical level, and said second logic gate changes its level of said first control signal in response to level change of said second control signal without responding to level change of said second control signal when said second control signal changes from said second logical level to said first logical level.

17. The conversion circuit as claimed in claim 16, wherein said charge pump circuit and said delay circuit has a current mirror circuit, respectively.

18. The conversion circuit as claimed in claim 16, wherein said delay circuit has a first current mirror circuit including a plurality of first channel transistors and a second current mirror circuit including a plurality of second channel transistors, each of first and second current mirror circuits is connected between said first and second logic gates.

19. The conversion circuit as claimed in claim 16, said conversion circuit further comprising a current control circuit for controlling a current flowing in said charge pump and said delay circuit.

* * * * *